(12) United States Patent
Arcus

(10) Patent No.: US 6,320,438 B1
(45) Date of Patent: Nov. 20, 2001

(54) DUTY-CYCLE CORRECTION DRIVER WITH DUAL-FILTER FEEDBACK LOOP

(75) Inventor: Christopher G. Arcus, San Jose, CA (US)

(73) Assignee: Pericom Semiconductor Corp., San Jose, CA (US)

( * ) Notice: Subject to any disclaimer, the term of this patent is extended or adjusted under 35 U.S.C. 154(b) by 0 days.

(21) Appl. No.: 09/641,282

(22) Filed: Aug. 17, 2000

(51) Int. Cl.$^7$ ................................................. H03K 3/017
(52) U.S. Cl. ............................ 327/175; 327/37; 327/165; 327/285
(58) Field of Search ................................. 327/37, 172, 173, 327/174, 175, 170, 277, 278, 261, 263, 264, 266, 284, 285, 287, 268, 165, 166, 113, 114; 375/238, 241; 331/40, 177 R

(56) References Cited

U.S. PATENT DOCUMENTS

| | | | |
|---|---|---|---|
| 4,408,168 | 10/1983 | Higuchi | 331/57 |
| 4,527,075 | 7/1985 | Zbinden | 327/175 |
| 4,736,118 | 4/1988 | Fischer | 327/175 |
| 4,926,178 | 5/1990 | Mallinson | 341/143 |
| 4,959,557 | 9/1990 | Miller | 327/175 |
| 5,208,595 | 5/1993 | Engel et al. | 341/143 |
| 5,231,320 | * 7/1993 | Kase | 327/277 |
| 5,477,180 | 12/1995 | Chen | 327/175 |
| 5,614,855 | 3/1997 | Lee et al. | 327/158 |
| 5,835,041 | 11/1998 | Zydek et al. | 341/143 |
| 5,856,753 | 1/1999 | Xu et al. | 327/175 |
| 5,869,992 | 2/1999 | Sekino | 327/276 |
| 5,907,254 | 5/1999 | Chang | 327/165 |
| 5,920,217 | 7/1999 | Mellot | 327/175 |
| 6,028,491 | 2/2000 | Stanchak et al. | 331/75 |

* cited by examiner

Primary Examiner—Timothy P. Callahan
Assistant Examiner—Minh Nguyen
(74) Attorney, Agent, or Firm—Stuart T. Auvinen

(57) ABSTRACT

A clock generator has a duty cycle correction circuit that adjusts the duty cycle to 50%. A modulator is an inverter with extra source-limiting transistors in series to the power and ground supplies. A control voltage of about Vcc/2 is applied to the source-limiting transistors, causing them to operate in the linear region with limited current. A slow-slew output from the modulator is buffered by a driver. The driver output is filtered by a linear detector with a series resistor and input capacitor. The detector output is compared to a reference voltage of Vcc/2 by an error amp. The error amp generates the control voltage fed back to the modulator. An output capacitor creates a dominant pole with the error amp to ensure stability. A variable-threshold gate can be added between the driver output and the detector to separately adjust the measurement threshold voltage from the reference voltage to the error amp.

15 Claims, 4 Drawing Sheets

DUTY-CYCLE CORRECTION DRIVER WITH DUAL-FILTER FEEDBACK LOOP

FIELD OF THE INVENTION

This invention relates to clock generators, and more particularly to clock duty-cycle correction circuits.

BACKGROUND OF THE INVENTION

Many complex electronic systems rely on synchronous or clocked digital circuits. For example, a microprocessor or central processing unit (CPU) often has a clock input that controls the timing of operations such as instruction decode and memory access. To ensure reliable operation, the microprocessor may have very strict input requirements for this clock input, such as frequency, voltage levels, and duty cycle.

As system designers compete with one another for the fastest-performing chips, they often squeeze internal delays and resort to design tricks that use both rising and falling edges of the clock. The clock's duty cycle then becomes more critical, since variations in duty cycle reduce available setup times to either the rising or falling edges of the clock. Thus a tendency for tighter duty-cycle requirements has occurred in highly competitive markets.

Clocks are generally produced by a crystal oscillator and passed through a driver before being input to a microprocessor or other very-large-scale-integration (VLSI) chip. System designers can use special clock drivers that adjust the clock's characteristics.

Many duty-cycle correctors use threshold-level compensation. The threshold level is adjusted to adjust the duty cycle. See U.S. Pat. No. 4,959,557 by Miller which uses a feedback loop to adjust the threshold of the input to buffer 48. These threshold-adjustment correctors are limited since adjusting the threshold voltage provides only a small change in duty cycle when a clock with sharp edges (high slew rate) is used. Large duty cycle adjustments, such as from 80%–20% to 50%—50% are not feasible unless perhaps a very slow-slewing clock is used.

Other clock drivers use slew-time compensation to adjust duty cycle over a wide range. A slow-slewing clock signal is modulated in a modulator. The modulator is a complementary metal-oxide-semiconductor (CMOS) inverter with additional transistors in series to power and ground. The additional series transistors have gates connected to a control voltage of about Vcc/2. The control voltage is adjusted slightly to limit current through the series transistors, adjusting a ratio of up and down source currents. This changes the up and down slew rates of the clock. The slow-slewing clock output by the modulator is then cleaned up to a high-slew-rate clock by a driver stage.

For example, U.S. Pat. No. 5,477,180 by Chen uses a CMOS modulator 16 that adjusts up and down source currents. A feedback loop from the modulator output is used to generate a control or bias voltage that controls the up and down source currents in the modulator. While such a circuit is useful, mismatch of $R_3$ and $R_4$ resistor values in the feedback loop can introduce duty-cycle detector sensing error. Further inaccuracies may occur since the modulator outputs a slow-slew clock that may need a further driver stage to sharpen the edges to a higher slew rate.

Since Chen's feedback loop senses the output from the modulator rather than the output from a later driver stage, the slow-slew clock is sensed by the feedback loop. Sensing a slow-slew clock rather than a high-slew clock is undesirable since errors can be increased and clock stability diminished. A more linear and stable duty-cycle corrector is desired.

Another duty-cycle adjustor is described in U.S. Pat. No. 5,907,254 by Chang. Two differential amps are used in his feedback loop(s). Both threshold and slew-time compensation are used in this complex feedback. While useful, a more accurate and linear duty-cycle correction circuit is desired that uses a single feedback loop. It is desired that the feedback loop senses the duty cycle of the actual clock driven to the microprocessor, not the slow-slew-rate clock output from the modulator. More accurate filtering of the duty cycle is desired that does not introduce distortions due to resistor mismatch within the filter. A smoothed control voltage is desired for controlling the source currents in the modulator to further reduce distortions and ensure clock stability.

SUMMARY OF THE INVENTION

A duty-cycle-correcting clock driver has a clock input that receives an input clock with an input duty cycle that varies from a target duty cycle. A modulator receives the input clock and generates an intermediate clock. It adjusts rise and fall delays of the intermediate clock in response to a control signal to adjust the input duty cycle. A driver receives the intermediate clock. It generates a final clock that is corrected to the target duty cycle by the modulator.

A feedback loop generates the control signal to the modulator. It receives the final clock. The feedback loop includes an error amplifier that amplifies a difference between a first input and a reference voltage applied to a second input to generate an amp output. A detector filter has a series resistor between the final clock and the first input of the error amplifier. The detector filter also has an input capacitor attached to the first input. An output capacitor is coupled to the amp output. It filters the amp output to generate the control signal to the modulator. Thus the feedback loop includes the series resistor and senses the final clock to generate the control signal for the modulator.

In further aspects of the invention the modulator has a source-limiting p-channel transistor having a gate coupled to the control signal and a source connected to a power supply, for limiting charging current in response to the control signal. A switching p-channel transistor is coupled to receive charging current from the source-limiting p-channel transistor. It has a gate coupled to the input clock and a drain driving the intermediate clock. A source-limiting n-channel transistor has a gate coupled to the control signal and a source connected to a ground supply. It limits discharging current in response to the control signal. A switching n-channel transistor is coupled to sink discharging current to the source-limiting n-channel transistor. It has a gate coupled to the input clock and a drain driving the intermediate clock.

In still further aspects the source-limiting p-channel transistor and the source-limiting n-channel transistor operate in a linear region.

In other aspects the control signal is a voltage of about Vcc/2 when the input duty cycle is 50%, but above Vcc/2 when the input duty cycle is above 50% and below Vcc/2 when the input duty cycle is below 50%. Thus the control signal varies in response to the input duty cycle.

In further aspects of the invention, the intermediate clock generated by the modulator has a slower slew rate than the final clock generated by the driver. Thus the driver improves slew rate.

In still further aspects a threshold gate is coupled to the final clock from the driver. It drives the series resistor in the detector filter with a modified signal derived from the final clock. The modified signal has transitions when the final clock crosses a measured threshold. The measures threshold is a switching threshold of the threshold gate. Thus the measured threshold determines threshold measurement of the final clock while the reference voltage determines when the control signal is adjusted.

DETAILED DESCRIPTION

The present invention relates to an improvement in clock generators with duty-cycle correction. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventor has realized that slope or slew-rate compensation is better than threshold compensation since a wider range of duty cycles can be corrected. The inventor has further realized that the output from the modulator performing slew-rate compensation is too slow in slew rate to be useful for clocks input to modern microprocessors without further driver stages. However, the slow-slew clock can be cleaned up to a high-edge rate clock using one or more driver stages after the modulator.

The inventor has further realized that the feedback loop that controls the modulator should detect the final clock rather than the slow-slew clock. Thus the feedback loop should take its input from the output of the driver, not from the output of the modulator. This improves accuracy since the sharp clock edges from the driver are less sensitive to noise.

The inventor also realizes that resistor mismatch can be eliminated by using a single series resistor in a filter in a detector in the feedback loop. A second output filter in the feedback loop allows the control or bias voltage to the modulator to be stabilized. The capacitor in the output filter sets the dominant pole in the loop, improving stability. The input threshold to the feedback loop can be separately controlled by a threshold inverter before the series resistor. The threshold inverter can be set to a same voltage threshold as that of the driver or microprocessor or to any other desired threshold, allowing more precise and flexible control of the duty cycle.

Figure 1:
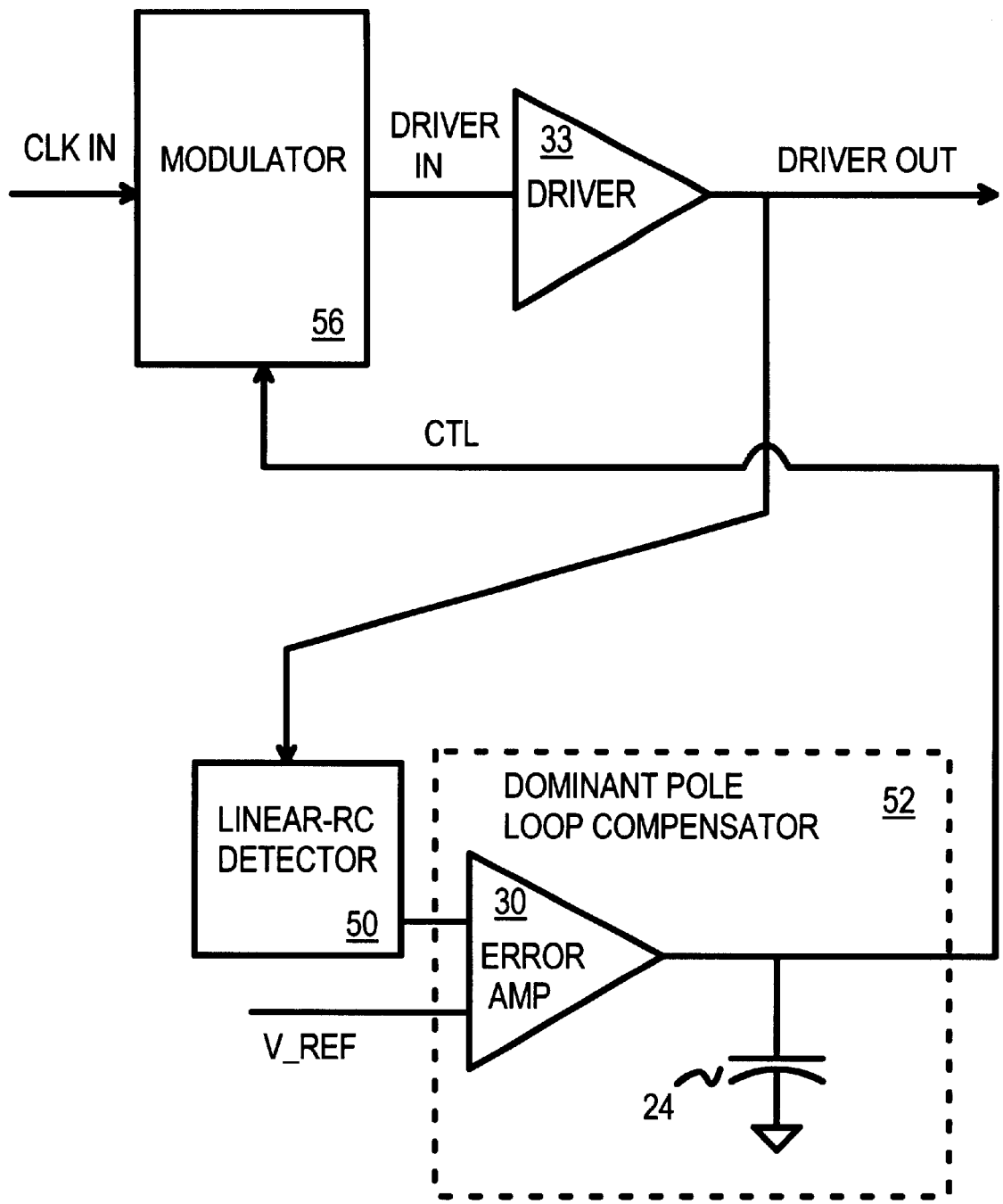
FIG. 1 is a block diagram of a slew-rate compensating clock driver that uses a feedback loop with two filters to adjust the duty cycle.

FIG. 1 is a block diagram of a slew-rate compensating clock driver that uses a feedback loop with two filters to adjust the duty cycle. A clock input from a crystal oscillator (not shown) is input to modulator 56. Modulator 56 is a slew-rate compensating inverter that adjusts the ratio of the up and down slew rates. The slew rates are changed by limiting source and sink currents through transistors in modulator 56 in response to control voltage CTL. The output from modulator 56, DRIVER_IN, has a very slow slew rate. The waveform of DRIVER_IN can be triangular in shape rather than a more desirable square wave. Driver 33 cleans up the output from modulator 56 using high-drive, high-speed transistors, producing a more square-wave output with high slew or edge rates on signal DRIVER_OUT. A clock input to a microprocessor or other VLSI chip can be driven by DRIVER_OUT.

The duty cycle, or percent of the clock cycle that the clock signal is high rather than low, is adjusted by a feedback loop. The duty cycle of clock input CLK_IN may not be exactly 50%—50% or even within a 5% or 10% tolerance as required by many microprocessors. Modulator 56 adjusts the duty cycle of the clock to the microprocessor, DRIVER_OUT, by changing the slew rate of DRIVER_IN. The high-going and low-going transition times or slew rates are adjusted by control signal CTL, which is a bias voltage generated by the feedback loop.

The feedback loop includes detector 50 and loop compensator 52. Detector 50 is connected to the output DRIVER_OUT from driver 33 so that the rapid-slew final clock signal is detected rather than the slow-slewing signal DRIVER_IN. Detector 50 includes an R-C filter that includes a series resistor, so that the filter is very linear, preventing duty cycle sensing error.

Loop compensator 52 includes error amp 30 and output capacitor 24. Error amp 30 is a high-gain $g_m$ amp or an output-transconductance amp (OTA). The dominant pole of the feedback loop is set by the equivalent resistance/impedance of error amp 30 and the capacitance of output capacitor 24. The high impedance of error amp 30 allows a small-valued output capacitor 24 to be used, reducing chip area. The output of error amp 30 is the control signal CTL, which is applied to the gates of the source-current-limiting transistors in modulator 56.

Error amp 30 is a differential amplifier that amplifies the voltage difference between a non-inverting (+) input and an inverting (−) input. The inverting input of error amp 30 is coupled to a voltage reference, such as half the power supply (Vcc/2) when a 50% duty cycle is desired. This reference voltage V_REF can be generated by a voltage divider of resistors or linear transistors. The non-inverting input of error amp 30 is coupled to the output of detector 50.

Detector 50 filters or integrates the clock output DRIVER_OUT to produce an average voltage for clock out. When the duty cycle of DRIVER_OUT is 50%, then the average voltage is Vcc/2. Since the two inputs to error amp 30 have the same voltage, the control voltage is not changed.

When the duty cycle is more than 50%, the average voltage rises above Vcc/2, and error amp 30 amplifies this difference to adjust control voltage CTL. The adjustment of CTL changes the duty cycle of DRIVER_IN generated by modulator 56. This duty cycle may be distorted somewhat by driver 33, but detector 50 measures the duty cycle of the final clock DRIVER_OUT. If the adjustment in duty cycle by modulator 56 was sufficient, then the average voltage is brought down to Vcc/2 and error amp 30 holds CTL constant. Otherwise, additional changes to CTL are made until the duty cycle reaches 50%. Since the final clock output DRIVER_OUT is integrated by detector 50, the feedback loop operates to drive the duty cycle of this final clock output to 50%, regardless of any duty-cycle distortions caused by driver 33.

Detailed Diagram 2

Figure 2:
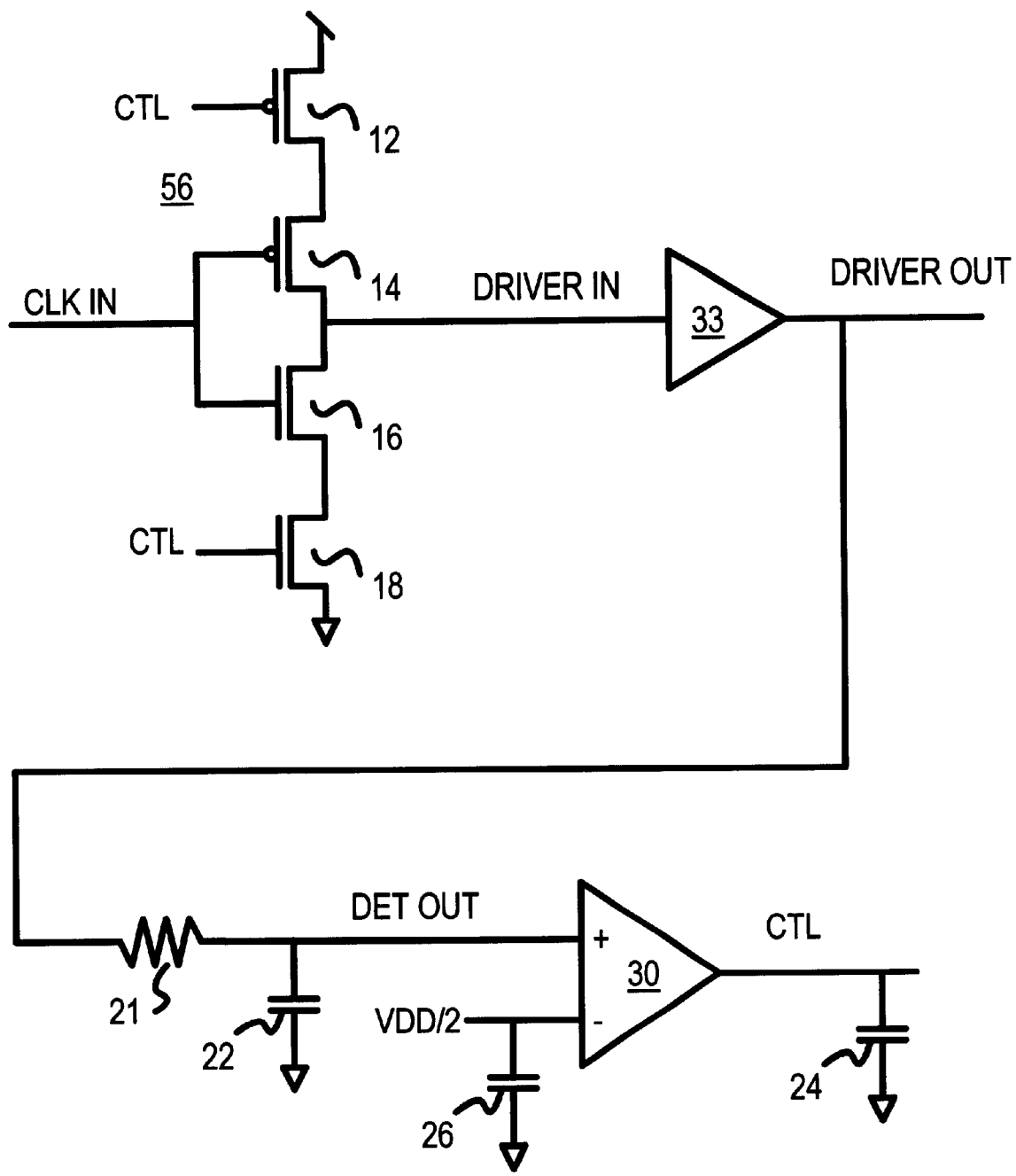
FIG. 2 is a more detailed schematic diagram of the duty-cycle correction circuit of FIG. 1.

FIG. 2 is a more detailed schematic diagram of the duty-cycle correction circuit of FIG. 1. Modulator 56 includes p-channel transistors 12, 14 and n-channel transistors 16, 18 all in series. The clock from the crystal oscillator, CLK_IN, is applied to the gates of transistors 14, 16, while the drains of transistors 14, 16 drive the modulator's output, DRIVER_IN.

The sources of transistors 14, 16 are not directly coupled to power and ground. Instead, source-limiting transistors 12, 18 are in series to limit the current. For example, the current from power to charge DRIVER_OUT through p-channel transistor 14 is limited by p-channel source-limiting transistor 12. Likewise, the current to ground to discharge DRIVER_OUT through n-channel transistor 16 is limited by n-channel source-limiting transistor 18. The limited current reduces the rise and fall times, or slew rates, of DRIVER_OUT.

The control voltage CTL is applied to the gates of source-limiting transistors 12, 18. This control voltage is ordinarily an intermediate voltage near Vcc/2, so that both source-limiting transistors 12, 18 are turned on. However, rather than being fully turned on by Vcc or ground, the intermediate voltage turns source-limiting transistors 12, 18 on, with a limited current drive capability.

When the control voltage CTL is adjusted by the feedback loop, the current drives of source-limiting transistors 12, 18 are also changed, but in opposite directions. For example, when CTL is raised from Vcc/2 to a higher voltage, n-channel source-limiting transistor 18 turns on more strongly and can deliver a higher current, while p-channel source-limiting transistor 12 turns on less strongly and delivers less current.

During the low-going transition of DRIVER_IN, when n-channel transistor 16 is on and p-channel transistor 14 is off, a higher current is available to discharge DRIVER_IN. Thus the higher discharge current produce a faster fall time. However, the high-going transition of DRIVER_IN, when n-channel transistor 16 is off and p-channel transistor 14 is on, a smaller current is available to charge DRIVER_IN. The smaller charging current produce a slower rise time. Thus the fall time is improved, but the rise time is slowed.

The faster fall time and slower rise time increases the amount of time the clock is in the low state, below the threshold voltage, but decreases the time the clock is in the high state, above the threshold. When a very slow slew rate occurs, the change in duty cycle can be significant.

Driver 33 buffers the modulator output, DRIVER_IN, to produce DRIVER_OUT with higher edge or slew rates. Some distortion of the duty cycle often occurs by driver 33, such as when the rise and fall times or current drivers are not exactly equal. Loading on the clock output DRIVER_OUT can also distort the duty cycle. This distortion is taken into account since the feedback loop senses the final clock, DRIVER_OUT.

The detector includes series resistor 21 and capacitor 22. Together they form an input R-C filter that integrates the output clock to generate an average voltage on signal DET_OUT. Since a single series resistor 21 is used, there is no resistor mismatch for high and low clock pulses. A very linear filter is provided by series resistor 21 and capacitor 22.

The detector integrates charge from clock DRIVER_OUT onto capacitor 22, so that the voltage across capacitor 22 is the average voltage of the clock, averaged over many clock cycles.

The average voltage from the detector on DET_OUT is applied to the inverting input of error amp 30. A reference voltage Vcc/2 is applied to the non-inverting input of error amp 30. Polarity of the error amplifier connection depends on the polarity of the driver and detector. If they are both non-inverting, then the correct error amp connection is non-inverting. Thus every block in the loop is non-inverting except the modulator, providing overall negative feedback. Bypass capacitor 26 on reference voltage Vcc/2 is useful for reducing supply noise and other noise that can couple into a voltage divider that generates Vcc/2. A small bypass capacitor is sufficient.

Error amp 30 amplifies the difference between the average voltage on DET_OUT and the reference voltage Vcc/2. When the duty cycle is exactly 50%, the average voltage DET_OUT should be Vcc/2. In that case error amp 30 leaves its output in the quiescent state, maintaining control signal CTL to modulator 56 at the same voltage.

When the duty cycle falls below 50%, the average voltage from the detector also falls below Vcc/2, and the voltage difference is amplified by error amp 30, lowering control voltage CTL. The lower control voltage CTL turns on p-channel source-limiting transistor 12 more strongly, reducing the rise time. The lower CTL voltage also turns on n-channel source-limiting transistor 12 more weakly, increasing the fall time. The faster rise time and slower fall time increase the high pulse of the clock, increasing duty cycle. This causes the average voltage DET_OUT to rise until Vcc/2 is reached.

Output capacitor 24 integrates the changes in the control voltage CTL by error amp 30. This smoothes out any ripple or instantaneous changes that might occur, producing a more stable output. The large impedance of error amp 30 allows a relatively small capacitance value to be used for output capacitor 24 while still achieving an R-C time constant of many clock cycles. The dominant pole of the feedback loop is set by the error amp impedance and output capacitor 24.

Since the feedback loop contains two filters, the filtering of the average voltage of the clock DRIVER_OUT can be adjusted separately from the loop stability or response time, which is set by the dominant pole with capacitor 24. More flexibility in the design results.

Feedback with Threshold Gate 3

Figure 3:
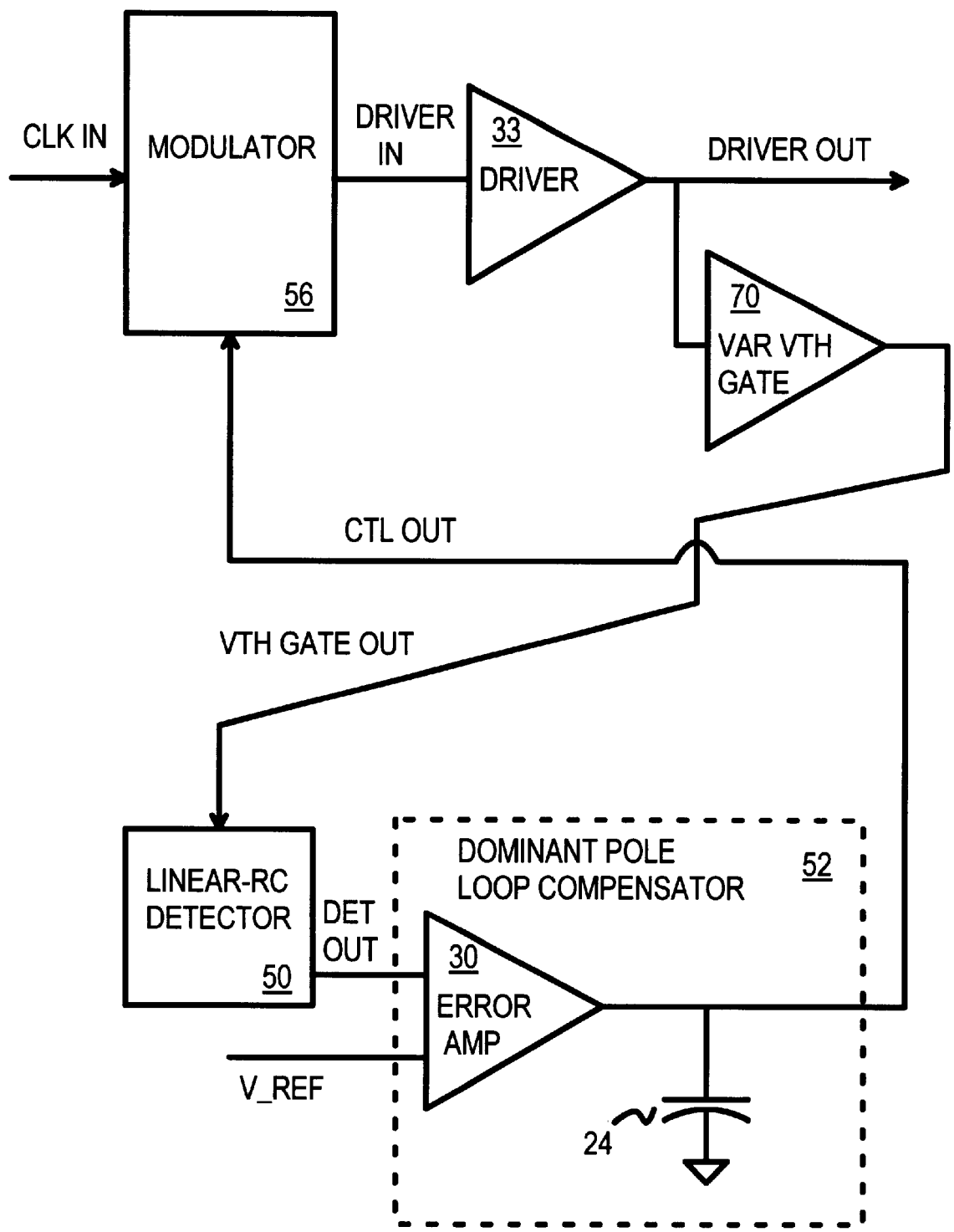
FIG. 3 is a block diagram of a slew-rate compensating clock driver with a feedback loop having a variable-threshold gate to sense the output clock.

FIG. 3 is a block diagram of a slew-rate compensating clock driver with a feedback loop having a variable-threshold gate to sense the output clock. The voltage threshold that determines when the clock is in the high and low states is not necessarily Vcc/2, but can take on other values, such as 1.4 volt with a 3.3-volt Vcc supply. Achieving a 50% duty cycle under these conditions can be problematic. The reference voltage to the inverting input of error amp 30 can be changed to 1.4 volt, or some other value, but it may be difficult to generate the exact threshold used by the chip receiving the clock.

More flexibility is achieved when threshold gate 70 is inserted into the feedback loop. Threshold gate 70 can have its switching threshold set by the designer by varying the size, drive, or configuration of the n-channel and p-channel transistors in the inverters used to implement threshold gate 70. The threshold of the duty-cycle detector can then be set the independent of the logic-level threshold of the detector. For example, the detector logic threshold can be set the same as the clock receiver, or to a level other than Vdd/2, while still maintaining duty cycle threshold at Vdd/2 and accurately providing 50% duty cycle. The output of threshold gate 70 is applied to the series resistor in detector 50 for integrating to produce the average voltage DET_OUT applied to error amp 30.

The threshold gate 70 also produces a very fast-edged rail-to-rail waveform to the detector, ideally causing the detector to sense duty-cycle very linearly and accurately.

The detector works by converting the logic threshold crossings to full rail-to-rail outputs. If the crossings are exactly 50%, and the threshold gate produces an ideal comparator output, the amount of up and down charging is exactly equal on the detector RC filter network. The filter output integrates the GND to VDD waveform producing an almost-DC waveform with an average level of Vdd/2. If the threshold gate is not present to make the output fully rail-to-rail, then an imbalance in up/down drive will upset the duty cycle sensing accuracy. Since a single series resistor is used, there can be no mismatch in resistors. The transistor strengths of the threshold gate may be made arbitrarily large enough to cause the output to swing close to Vdd and Gnd. If the series R is much higher than the transistor impedances, error is minimal. The error is given by:

Duty cycle measurement error=(Rp−Rn)/Rseries

Where Rp=threshold inverter p-channel impedance
Rn=threshold inverter n-channel impedance Typical Rp and Rn values might be less than 50 Ohms while (Rp−Rn) might be under 10 Ohms. With a 10 k resistor, detector errors of less than 0.1% are possible.

Loop compensator 52 includes error amp 30 and output capacitor 24. The dominant pole of the feedback loop is still set by the equivalent resistance/impedance of error amp 30 and the capacitance of output capacitor 24. The output of error amp 30 is the control signal CTL, which is applied to the gates of the source-current-limiting transistors in modulator 56.

The inverting input of error amp 30 is coupled to a voltage reference, such as half the power supply (Vcc/2) when a 50% duty cycle is desired, or other values when other duty cycles are desired. For example, if a 60% high, 40% low waveform is desired, the detector output at equilibrium is 60% of Vdd. So when this duty cycle is desired, the duty error amp reference voltage should be set to 0.6 Vdd. Then the detector output will match the error amp reference and the loop will settle to those conditions. This reference voltage V_REF can be generated by a voltage divider of resistors or linear transistors. The non-inverting input of error amp 30 is coupled to the output of detector 50.

Modulator 56 adjusts the ratio of the up and down slew rates. The slew rates are changed by limiting source and sink currents through linear-mode transistors in modulator 56 in response to control voltage CTL. The output from modulator 56, DRIVER_IN, has a very slow slew rate. Driver 33 cleans up the output from modulator 56 using high-drive, high-speed transistors, producing a more square-wave output with high slew or edge rates on signal DRIVER_OUT. A clock input to a microprocessor or other VLSI chip can be driven by DRIVER_OUT.

Threshold gate 70 controls the duty-cycle measurement logic threshold, or the threshold at which the output clock is considered to be high or low. The duty-cycle adjustment threshold is set by the reference voltage to error amp 30. The duty-cycle adjustment threshold is the voltage that the detector output (the average voltage integrated by the detector) is compared to, for determining when and by how much to adjust the control voltage. These two thresholds can be adjusted separately, allowing for more flexible and accurate design of the feedback loop.

Waveforms 4

Figure 4:
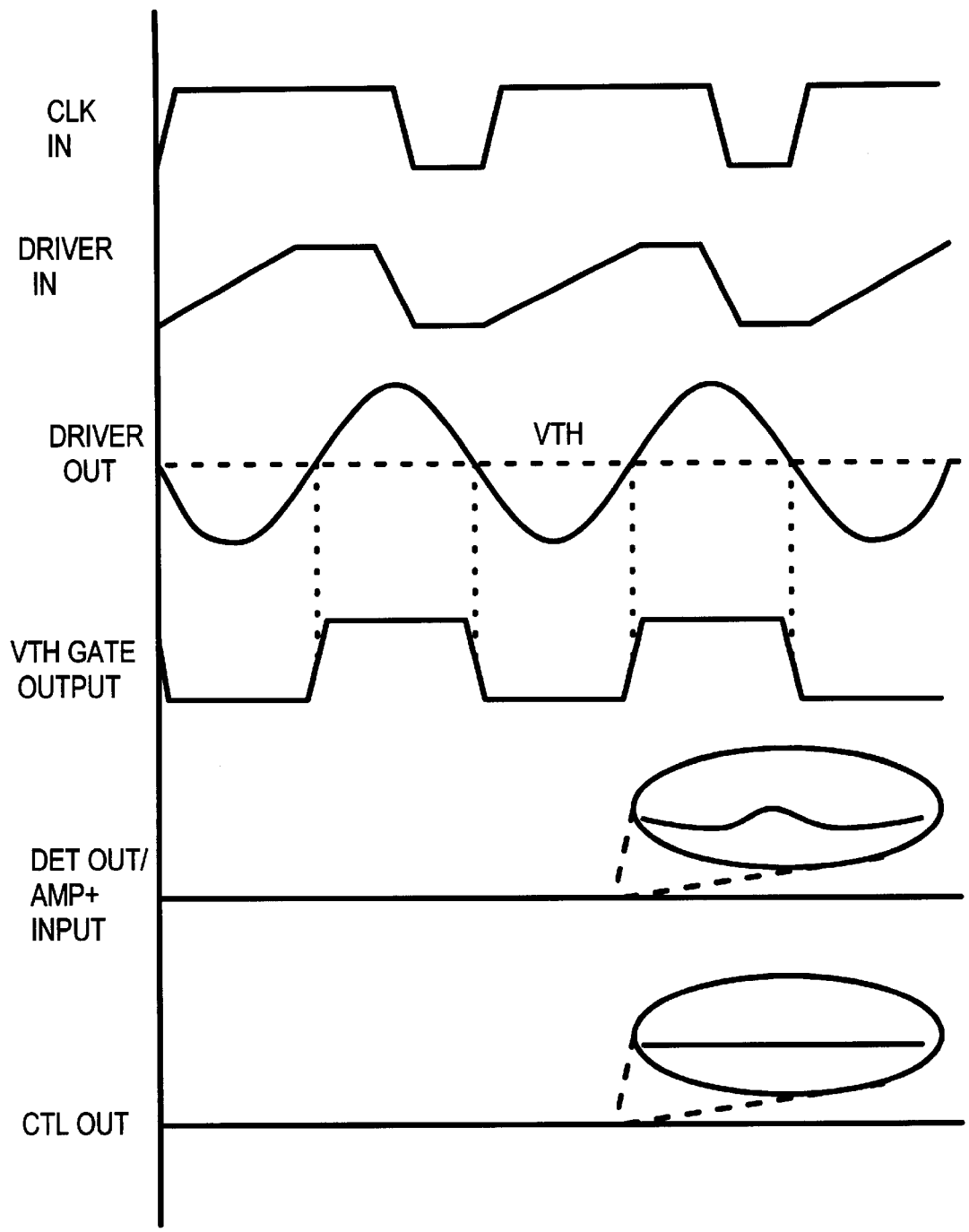
FIG. 4 is a waveform diagram showing operation of the duty-cycle corrector using the feedback loop with two filters and a feedback-threshold gate.

FIG. 4 is a waveform diagram showing operation of the duty-cycle corrector using the feedback loop with two filters and a feedback-threshold gate. The input clock from the crystal is significantly skewed, having about an 80%–20% duty cycle. The modulator has its current limited by the source-limiting transistors and thus has slow rise and fall times as shown in the DRIVER_IN waveform that is output by the modulator. The feedback loop has acted to adjust the control voltage to be greater than Vcc/2, so that the fall time is faster than the rise time. This difference in rise and fall times from the modulator compensates for the 80%–20% duty cycle of the clock input.

The driver buffers DRIVER_IN to generate DRIVER_OUT. The high capacitive loading of the clock line causes DRIVER_OUT to have a smoothed shape, although the rise and fall times are much faster than for DRIVER_IN.

The switching threshold VTH of the variable-threshold gate is shown as a dashed line on the DRIVER_OUT waveform. When DRIVER_OUT crosses the VTH threshold, the variable-threshold gate switches or transitions. The voltage level of VTH can be adjusted higher or lower by the circuit designer to optimize the feedback design independently of the input threshold of the microprocessor or other chip receiving DRIVER_OUT.

The variable-threshold gate outputs VTH_GATE_OUTPUT with transitions at each VTH crossing of DRIVER_OUT. The rise and fall times are short due to the relatively low input capacitance of the detector with the series resistor. The series resistor and input capacitor in the detector filter the output of the variable-threshold gate to produce the detector output DET_OUT, which is also the +input to the error amp. Small perturbations occur on the DET_OUT waveform near the transitions of the VTH_GATE_OUTPUT signal as the input capacitor is charged and discharged slightly. These perturbations are filtered out by the error amp and output capacitor, producing a stable CTL signal to the modulator.

The voltage of CTL is above Vcc/2, causing the modulator to compensate for the 80%–20% duty clock input with slow rise and fast fall times. This increases the low clock pulse and decreases the high clock pulse so that the final clock DRIVER_OUT has a 50%—50% duty cycle.

Values of the series resistor and input capacitor are chosen to filter the clock output. Detector values such as 5 pF and 10 k are sufficient to filter a 100-MHz clock waveform yielding accurate results. Values such as 10 pF are often sufficient for dominant-pole loop stability and to filter and stabilize the modulator control voltage, ensuring that the clock output will be noise and jitter free. The gain of the error amp and the output capacitance are chosen to set a very low frequency dominant pole. Typical high gain amps have impedances of 100 Meg-ohm or more, allowing a small capacitance to be used for the output amp. Together with the negative feedback of the loop, loop stability is ensured when the dominant pole (error amp and output capacitor) has a much lower frequency than the detector pole (series resistor and input capacitor).

ADVANTAGES OF THE INVENTION

A more accurate and linear duty-cycle correction circuit is described that uses a single feedback loop. The feedback loop senses the duty cycle of the actual clock driven to the microprocessor, not the slow-slew-rate clock output from the modulator. More accurate filtering of the duty cycle is obtained. Distortions due to resistor mismatch within the filter are not added, and any distortions from the driver are accounted for by the feedback loop. A smoothed control voltage is generated by the output capacitor and error amp that controls the source currents in the modulator to further reduce distortions and ensure clock stability.

The high impedance of the error amp allows a small-valued output capacitor to be used, reducing chip area. Thus the circuit is easily integrated on an integrated circuit with other functions or circuits. The error amp and output capacitance set a dominant pole that ensures loop stability, while a separate detector filter uses a series resistance and input capacitor to integrate the output clock. The detector filter is very linear, improving accuracy. Using a variable-threshold gate in front of the detector allows the measurement threshold of the clock duty cycle to be set independently of the threshold to the error amp that adjusts the duty cycle. Thus measurement and adjustment of the duty cycle are separated, allowing more flexibility in design. This also increases the accuracy of the detector and the overall accuracy of the correction loop.

ALTERNATE EMBODIMENTS

Several other embodiments are contemplated by the inventor. For example polarity can be modified and inversions used. The driver can be replaced with an inverting driver and an inversion added to the feedback loop, such as by swapping the inputs to the error amp or using an inverting variable-threshold gate. More complex gates such as Schmitt triggers with hysteresis can be used for the variable threshold gate. Other kinds of integrators can be substituted.

Other target duty cycles besides 50% can be used by adjusting the reference voltage and thresholds. A wide range of device sizes and values can be used. The feedback loop can take its input from other intermediate stages of the driver buffer, and additional buffer/driver stages may be added.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

I claim:

1. A duty-cycle-correcting clock driver comprising:

clock input for receiving an input clock with an input duty cycle that varies from a target duty cycle;

a modulator, receiving the input clock and generating an intermediate clock, for adjusting rise and fall delays of the intermediate clock in response to a control signal to adjust the input duty cycle;

a driver, receiving the intermediate clock, for generating a final clock, the final clock being corrected to the target duty cycle by the modulator;

a feedback loop for generating the control signal to the modulator, receiving the final clock, the feedback loop including:

an error amplifier for amplifying a difference between a first input and a reference voltage applied to a second input to generate an amp output;

a detector filter having a series resistor between the final clock and the first input of the error amplifier, the detector filter also having an input capacitor attached to the first input; and an output capacitor, coupled to the amp output, for filtering the amp output to generate the control signal to the modulator, wherein the modulator comprises:

a source-limiting p-channel transistor having a gate coupled to the control signal and a source connected to a power supply, for limiting charging current in response to the control signal;

a switching p-channel transistor, coupled to receive charging current from the source-limiting p-channel transistor, having a gate coupled to the input clock and a drain driving the intermediate clock;

a source-limiting n-channel transistor having a gate coupled to the control signal and a source connected to a ground supply, for limiting discharging current in response to the control signal;

a switching n-channel transistor, coupled to sink discharging current to the source-limiting n-channel transistor, having a gate coupled to the input clock and a drain driving the intermediate clock, whereby the feedback loop includes the series resistor and senses the final clock to generate the control signal for the modulator.

2. The duty-cycle-correcting clock driver of claim 1 wherein the source-limiting p-channel transistor and the source-limiting n-channel transistor operate in a linear region.

3. The duty-cycle-correcting clock driver of claim 2 wherein the control signal is a voltage of about Vcc/2 when the input duty cycle is 50%, but above Vcc/2 when the input duty cycle is above 50% and below Vcc/2 when the input duty cycle is below 50%, whereby the control signal varies in response to the input duty cycle.

4. The duty-cycle-correcting clock driver of claim 1 further comprising:

a threshold gate, coupled to the final clock from the driver, for driving the series resistor in the detector filter with a modified signal derived from the final clock, the modified signal having transitions when the final clock crosses a measured threshold, the measures threshold being a switching threshold of the threshold gate;

whereby the measured threshold determines threshold measurement of the final clock while the reference voltage determines when the control signal is adjusted.

5. The duty-cycle-correcting clock driver of claim 4 wherein the reference voltage is Vcc/2, half of a Vcc power supply voltage, and wherein the target duty cycle is 50%, whereby the first input is an average voltage of the final clock integrated by the detector filter.

6. The duty-cycle-correcting clock driver of claim 5 further comprising:

a bypass capacitor coupled to the reference voltage, for reducing noise on the reference voltage, whereby noise is reduced.

7. The duty-cycle-correcting clock driver of claim 4 wherein a dominant pole is set by a gain of the error amplifier and the output capacitor, while a detector pole is set by the series resistor and the input capacitor in the detector filter;

wherein the detector pole has a higher frequency than the dominant pole, whereby loop stability is ensured by the dominant pole.

8. A duty-cycle corrector comprising:

a clock input for an input clock;

a modulator for altering rising and falling-transition slew rates in response to a control signal, the modulator outputting an intermediate clock;

wherein the modulator comprises:
  a source-limiting p-channel transistor having a gate coupled to the control signal and a source connected to a power supply, for limiting charging current in response to the control signal;
  a switching p-channel transistor, coupled to receive charging current from the source-limiting p-channel transistor, having a gate coupled to the input clock and a drain driving the intermediate clock;
  a source-limiting n-channel transistor having a gate coupled to the control signal and a source connected to a ground supply, for limiting discharging current in response to the control signal; and
  a switching n-channel transistor, coupled to sink discharging current to the source-limiting n-channel transistor, having a gate coupled to the input clock and a drain driving the intermediate clock;

a driver, receiving the intermediate clock and driving an output clock;

an error amp having a reference input and a sensing input, for generating the control signal in proportion to a difference between the sensing input and the reference input;

an output capacitor, coupled between the control signal and a ground, for reducing ripple on the control signal;

a series resistor, coupled between the output clock and the sensing input; and an input capacitor, coupled between the sensing input and the ground, the series resistor and the input capacitor forming a detector filter while impedance of the error amp and the output capacitor forming a second filter, whereby two filters in a feedback loop adjust the control signal to modulate the input clock.

9. The duty-cycle corrector of claim 8 wherein a product of the series resistor and the input capacitor's capacitance is greater than a frequency of the output clock, whereby the series resistor and input capacitor filter the output clock.

10. The duty-cycle corrector of claim 9 wherein the sensing input has a voltage that is an average voltage of the output clock, whereby the series resistor and input capacitor integrate charge on the output clock over several clock cycles.

11. The duty-cycle corrector of claim 10 wherein the reference input is coupled to a middle voltage, the middle voltage being about half of a power-supply voltage when the output clock has a 50% duty cycle.

12. The duty-cycle corrector of claim 11 further comprising:
  a threshold gate, having an input coupled to the output clock and an output connected to the series resistor, for switching states when the output clock crosses a measured threshold voltage, the measured threshold voltage being a switching threshold of the threshold gate that varies with device sizes within the threshold gate,
  whereby the measured threshold voltage determines threshold measurement of the output clock while the middle voltage determines when the control signal is adjusted by the error amp.

13. The duty-cycle corrector of claim 12 further comprising:
  a bypass capacitor, coupled between the reference input and the ground, for reducing supply noise input to the error amp.

14. A duty-cycle correction circuit comprising:
  modulator means, receiving an input clock with an unadjusted duty cycle, for adjusting rise and fall slew rates of an intermediate clock generated by the modulator means in response to a control voltage to adjust duty cycle;
  driver means, receiving the intermediate clock, for buffering the intermediate clock to generate a measured clock, the measured clock having an adjusted duty cycle;
  detector means, coupled to receive the measured clock, for integrating the measured clock to generate a filtered clock, the detector means including a series resistor between the measured clock and an input capacitor on a sensing node;
  differential amp means, receiving the sensing node from the detector means, for comparing the sensing node to a reference voltage to generate the control voltage; and
  output capacitor means, coupled between the control voltage and a ground, for filtering the control voltage;
  wherein the modulator means comprises:
    source-limiting p-channel transistor means, having a gate coupled to the control voltage, for limiting charging current in response to the control voltage;
    switching p-channel transistor means, coupled to receive charging current from the source-limiting p-channel transistor means, having a gate coupled to the input clock, for driving the intermediate clock with the charging current;
    source-limiting n-channel transistor means, having a gate coupled to the control voltage, for limiting discharging current in response to the control voltage; and
    switching n-channel transistor means, coupled to sink discharging current to the source-limiting n-channel transistor means, having a gate coupled to the control voltage, for driving the intermediate clock,
  whereby the source-limiting p-channel and n-channel transistor means limit current to control rising and falling-transition slew rates of the intermediate clock and whereby feedback includes two filters, an input filter having an RC time constant defined by the input capacitor and series resistor, and an output filter having an RC time constant defined by the output capacitor means and an impedance of the differential amp means.

15. The duty-cycle correction circuit of claim 14 wherein the differential amp means is a high-gain amplifier or an output-transconductance amp.

* * * * *